United States Patent
Chu et al.

(10) Patent No.: US 9,052,356 B2
(45) Date of Patent: Jun. 9, 2015

(54) EMBEDDED PHOTON EMISSION CALIBRATION (EPEC)

(75) Inventors: Albert M. Chu, Essex, VT (US); Ronald A. Piro, Essex Junction, VT (US); Daryl M. Seitzer, Essex Junction, VT (US); Rohit Shetty, Essex Junction, VT (US); Thomas W. Wyckoff, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 656 days.

(21) Appl. No.: 13/396,775

(22) Filed: Feb. 15, 2012

(65) Prior Publication Data

US 2013/0211749 A1    Aug. 15, 2013

(51) Int. Cl.
*G01R 31/00* (2006.01)
*G01R 31/311* (2006.01)

(52) U.S. Cl.
CPC ................... *G01R 31/311* (2013.01)

(58) Field of Classification Search
CPC ................. G01N 21/67; G01R 31/311
See application file for complete search history.

(56) References Cited

U.S. PATENT DOCUMENTS

| | | |
|---|---|---|
| 5,661,520 A | 8/1997 | Bruce |
| 5,760,892 A | 6/1998 | Koyama |
| 5,892,539 A | 4/1999 | Colvin |
| 6,133,740 A * | 10/2000 | Wentworth et al. ........... 324/464 |
| 6,275,205 B1 | 8/2001 | Winer |
| 6,355,965 B1 | 3/2002 | He et al. |
| 6,810,344 B1 | 10/2004 | Iwasa |
| 6,909,295 B2 | 6/2005 | Polonsky et al. |
| 7,113,630 B2 | 9/2006 | Dajee et al. |
| 7,932,739 B2 | 4/2011 | Liang et al. |
| 2005/0062490 A1 | 3/2005 | Polonsky et al. |
| 2009/0150098 A1 | 6/2009 | Khurana |

OTHER PUBLICATIONS

J. Xu et al., "Fabrication of visibly photoluminescent Si microstructures by focused ion beam implantation and wet etching", Appl. Phys. Lett. 65 (16), Oct. 17, 1994, pp. 2081-2083.

* cited by examiner

*Primary Examiner* — Elias Desta
(74) *Attorney, Agent, or Firm* — Gibb & Riley, LLC; David A. Cain, Esq.

(57) ABSTRACT

A semiconductor device structure is embedded within a semiconductor chip that calibrates a photon-emission luminosity scale by running multiple known currents through the device. The method comprises embedding at least one photon emission device in an integrated circuit having at least one functional device. A control current is applied to the at least one photon emission device. The photon emission intensity produced by the at least one photon emission device is captured. The current density of the at least one photon emission device is calculated. A test current is applied to the at least one functional device. The photon emission intensity produced by the at least one functional device is captured. The current density of the at least one functional device is estimated based on a comparison with the calculated current density of the at least one photon emission device.

24 Claims, 9 Drawing Sheets

| DE | RE | IC | PAD | RO | Mode |
|----|----|----|-----|-----|----------|
| 1  | 0  | 0  | DI  | -   | Driver   |
| 0  | 1  | 0  | 0   | 0   | Receiver |
| 0  | 1  | 0  | 1   | 1   | Receiver |
| 0  | 1  | 0  | High-Z | X | Tri-State |
| 0  | 0  | OSC | Test | 0 | EPEC |

EMBEDDED PHOTON EMISSION CALIBRATION (EPEC)

BACKGROUND

The present disclosure relates generally to semiconductor integrated circuit (IC) diagnostics, and more specifically, to methods of non-invasive optical IC diagnostics using light emission from leakage currents in field-effect transistors.

One of the methods of IC diagnostics of semi-conductor devices is physical failure analysis (PFA) using photon emission microscopy (PEM). This method uses visible and near infrared photon emission from transistors, pn junctions, and similar structures to find unexpected device current and make conclusions about the operation of the IC.

PEM can use time integrating detectors (such as CCD cameras, Focal Plane Arrays, etc.) to obtain the data, as well as time-resolved detectors (such as multichannel plate photomultipliers, single photon avalanche diodes, photomultipliers, etc.). The PEM can be performed from both the front-side and backside of an IC.

As the size of transistors decreases, two types of parasitic leakage currents become increasingly important—gate tunneling current (this type of current is also present in some capacitors) and OFF-state drain to source current. Each type of leakage current results in photon emission or, simply, leakage light. In general, the leakage light increases with the increase of leakage current as well as the increase of the voltage difference applied to the device.

One limitation of PEM is that it will identify the high current location, but will not be able to quantify the amount of current. Typically, a separate destructive PFA is required to de-layer and probe the device to determine the current.

SUMMARY

According to one embodiment, a semiconductor device is embedded within a semiconductor chip, which calibrates a photon-emission luminosity scale by running multiple known currents through the device and measuring the light leakage.

Embodiments described herein disclose a method for calibration of the luminosity-to-current function on photon-emission readings from semiconductors. More specifically, the method discloses a way to calibrate a photon-emission luminosity scale on a specific design by running multiple known currents though a known device that is embedded on the chip.

The basic concept is to create an observable reference photon emission structure that emits known image intensities for known device currents and embedding the reference photon emission structure in the semi-conductor chip. During PEM analysis, the reference structure can be used to provide the image intensity produced by a known current providing real-time calibration, at the same magnification/gain levels, for observation of a device under test (DUT). The image intensity produced by the DUT can be compared to the reference device to immediately estimate the device current without further destructive PFA.

According to one embodiment herein, a method is disclosed comprising embedding at least one photon emission device in an integrated circuit having at least one functional device. A control current is applied to the at least one photon emission device and the at least one functional device. The photon emission intensity produced by the at least one photon emission device is captured. The current density of the at least one photon emission device is calculated based on the photon emission intensity produced by the photon emission device. The photon emission intensity produced by the at least one functional device is captured. The current density of the at least one functional device is estimated based on the calculated current density of the at least one photon emission device.

According to another embodiment herein, a system for performing physical failure analysis techniques for analyzing semi-conductor devices using photon emission microscopy is disclosed. The system comprises a semiconductor chip comprising at least one photon emission device and at least one functional device, and test equipment that collects and compares light emission data from the at least one photon emission device with light emission data from the at least one functional device.

According to another embodiment herein, an article of manufacture comprising an integrated circuit is disclosed. The integrated circuit comprises a control input operatively connected to at least one photon emission device and at least one functional device. The at least one photon emission device has a known image intensity for a known current. The integrated circuit further comprises a measure input operatively connected to the at least one photon emission device and the at least one functional device. The at least one photon emission device and the at least one functional device are embedded in a semiconductor chip.

BRIEF DESCRIPTION OF THE DRAWINGS

The embodiments herein will be better understood from the following detailed description with reference to the drawings, which are not necessarily drawing to scale and in which:

FIG. 7 is a diagram of a truth table associated with the I/O cell of FIG. 7;

DETAILED DESCRIPTION

As mentioned above, conventional systems typically use Photon Emission Microscopy (PEM) in Physical Failure Analysis (PFA) to find unexpected current in a semi-conductor device. A limitation to the typical PEM approach is that it will identify a high current location, but will not be able to quantify the amount of current. A separate destructive PFA is required to de-layer and probe the semi-conductor device to determine the actual current value. The systems and methods herein address these issues by providing a semiconductor device embedded within a semiconductor chip, which calibrates a photon-emission luminosity scale by running multiple known currents through the device and measuring the light leakage. An observable reference photon emission structure that has known device currents is embedded in a semi-conductor chip. During PEM analysis, the reference structure can be used to provide the image intensity of a known current providing real-time calibration, at the same magnification/gain levels, for observation of a device under test. The image intensity of the device under test can be compared to the reference device to immediately estimate the device current without further destructive PFA.

One aspect of the systems and methods herein is that a reference calibration circuit is embedded in a standard library circuit such as an I/O circuit that would routinely be used on a semiconductor chip, thereby providing emission calibration for any structure on the chip. According to an embodiment herein, an article of manufacture comprising an integrated circuit is disclosed. The integrated circuit comprises a control input operatively connected to at least one photon emission device and at least one functional device. The at least one photon emission device has a known image intensity for a known current. The integrated circuit further comprises a measure input operatively connected to the at least one photon emission device and the at least one functional device. The at least one photon emission device and the at least one functional device are embedded in a semiconductor chip. As described herein, the photon emission devices may be nFET or pFET type transistors. Other types of devices are also contemplated for the photon emission devices. Additionally, as described herein, the functional devices may be nFET or pFET type transistors. Other types of devices are also contemplated for the functional devices.

Figure 1:
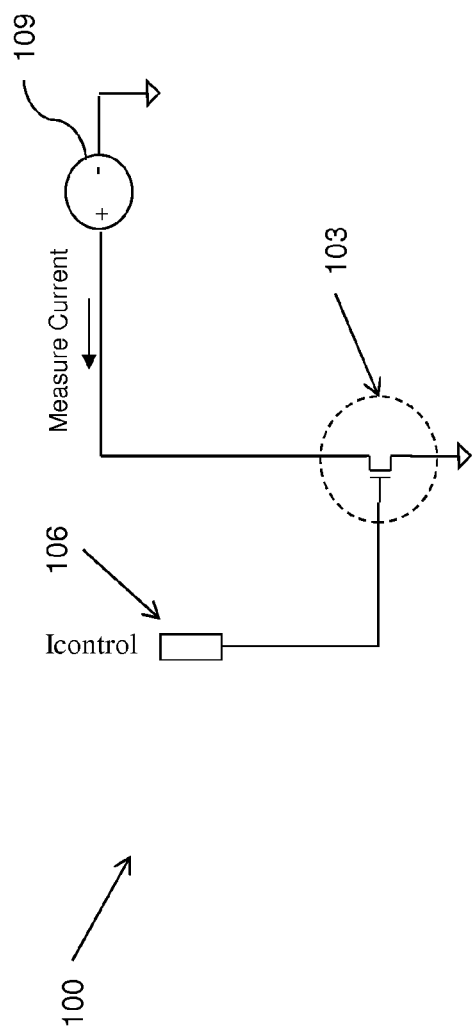
FIG. 1 is a schematic diagram illustrating embodiments herein.
Figure 2:
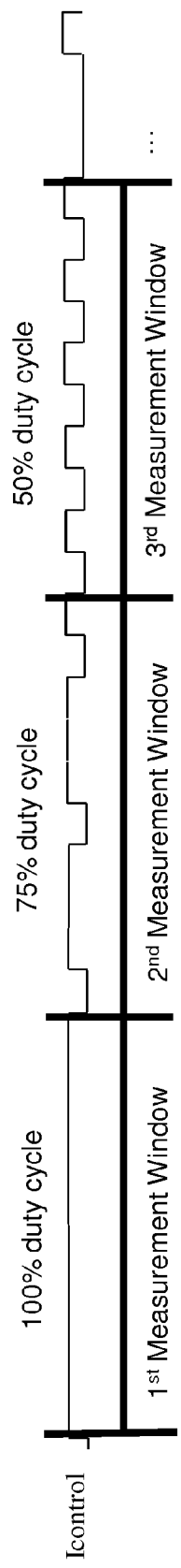
FIG. 2 is a timing diagram for the device illustrated in FIG. 1.

Referring to FIGS. 1 and 2, a circuit 100 for determining reference photon emission luminosity is shown in FIG. 1. The circuit 100 includes a photon emission device 103 having a control current (Icontrol) 106 input and a measure current 109 input. A basic photon emission calibration technique involves modulation of the bias voltage or duty cycle to the gate or source of the photon emission device 103 to capture multiple average current/emission intensity points. An example of a timing diagram for circuit 100 having a plurality of current measurement windows for obtaining multiple luminosity readings is shown in FIG. 2. By running multiple known currents though a known device that is embedded on the chip, a photon-emission luminosity scale can be obtained.

Figure 3:
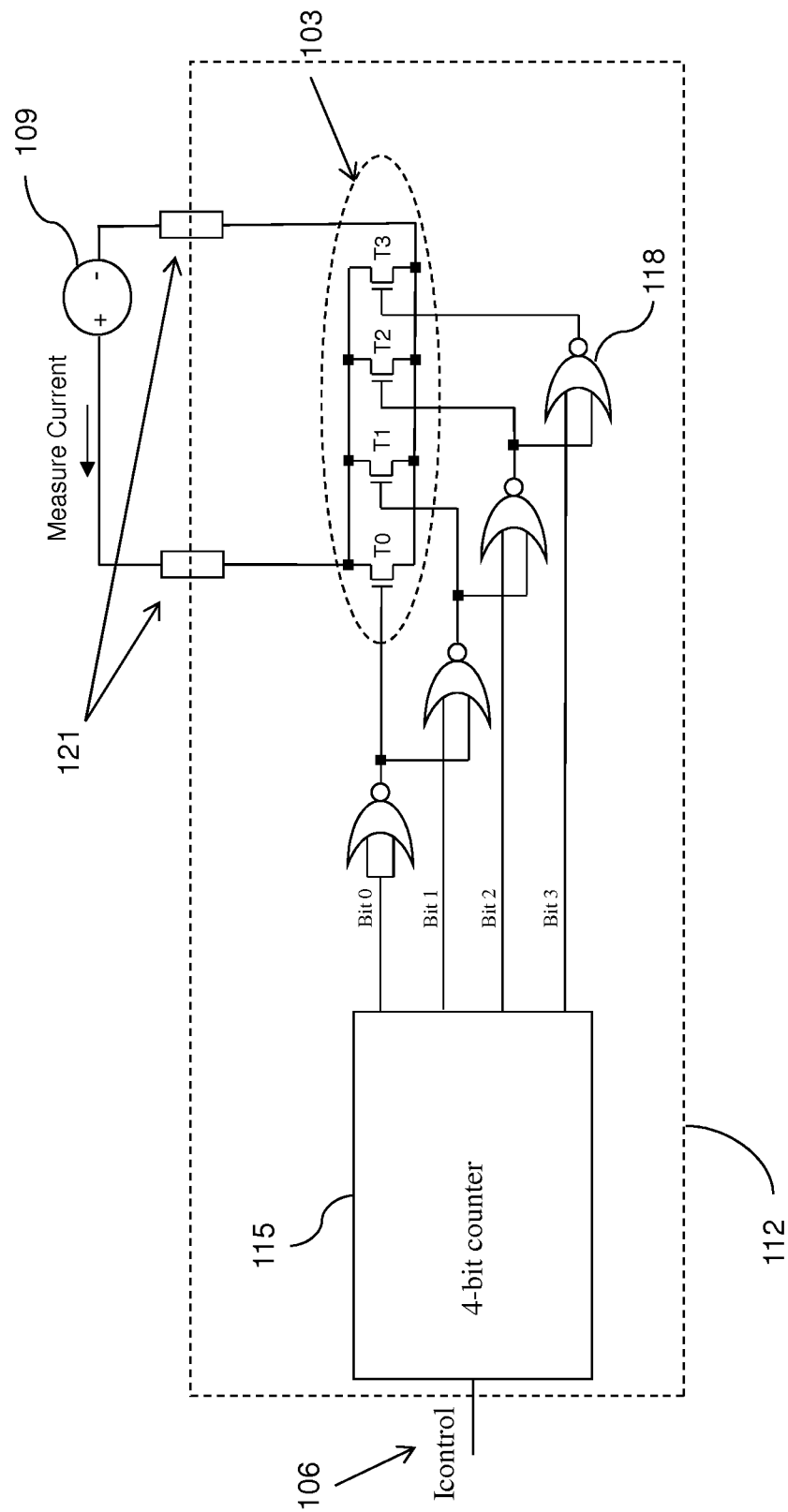
FIG. 3 is a schematic diagram illustrating embodiments herein.

FIG. 3 is a schematic diagram of an I/O cell 112 according to embodiments herein. In the illustrated embodiment, four photon emission devices 103 are operationally connected to a control current 106 through a gate control unit 115, such as a bit counter. The gate control unit 115 is used to toggle the control current 106 applied to each photon emission device 103 through a NOR gate, such as 118, connected to provide each photon emission device with a gate connection having a different duty cycle. In the illustrated embodiment, four photon emission devices 103 are shown. More or fewer photon emission devices 103 may be used, as desired. Typically, multiple physically isolated devices will be installed on a single product chip.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

Figure 4:
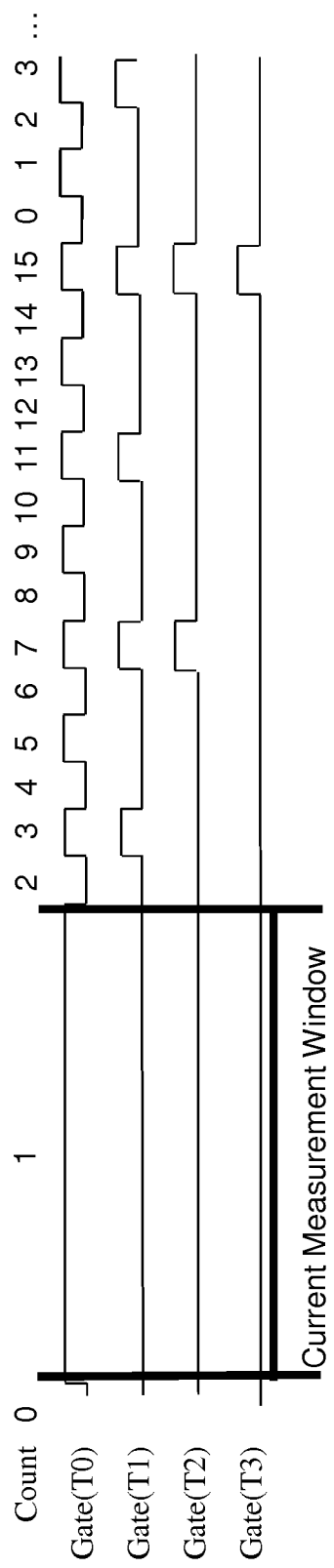
FIG. 4 is a timing diagram for the device illustrated in FIG. 3.

A timing diagram for I/O cell 112 is shown in FIG. 4. The timing diagram shows a plurality of current measurement windows for obtaining multiple luminosity readings associated with the control current 106 passed through each respective NOR gate 118 for each of the four photon emission devices 103. Readings for the measure current 109 in the photon emission devices 103 can be obtained at the current observation taps 121.

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 5:
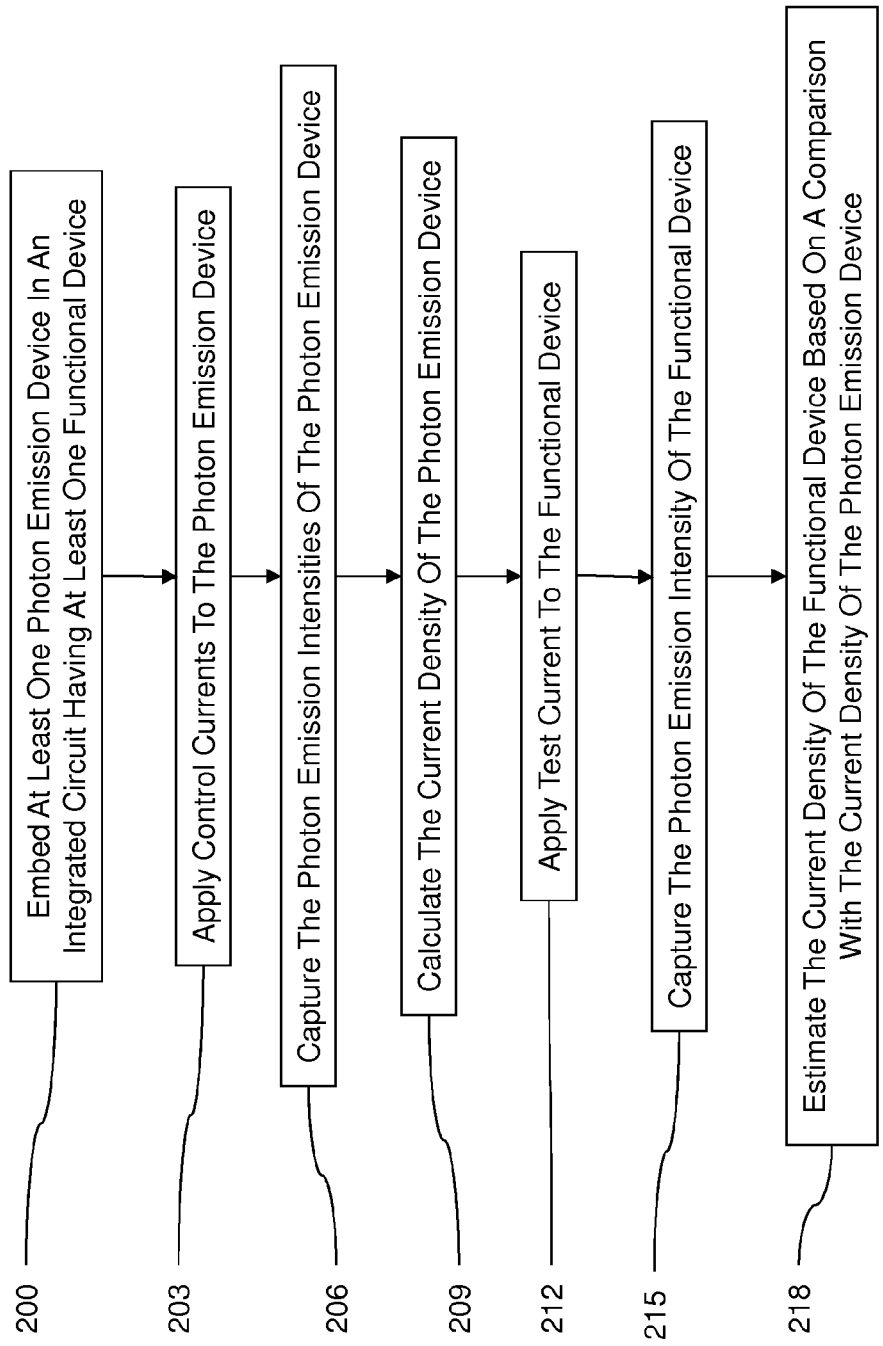
FIG. 5 is a flow diagram illustrating embodiments herein.

Referring to FIG. 5, a method according to one embodiment herein is shown. First, at least one photon emission device is embedded in an integrated circuit having at least one functional device, at 200. Typically, the photon emission device will have a known image intensity for a known current. At 203, a plurality of control currents is applied to the at least one photon emission device. A plurality of photon emission intensities produced by the at least one photon emission device when the control currents are applied is captured, at 206. At 209, a plurality of calibration current densities of the at least one photon emission device is calculated. The current densities are based on the photon emission intensity produced by the photon emission device to establish a device specific calibration relationship between photon emission intensity and current density. Then, at 212, a test current is applied to the at least one functional device. At 215, the photon emission intensity produced by the functional device is captured. Finally, at 218, the current density of the functional device is estimated based on a comparison with the calculated current density of the photon emission device.

Figure 6:
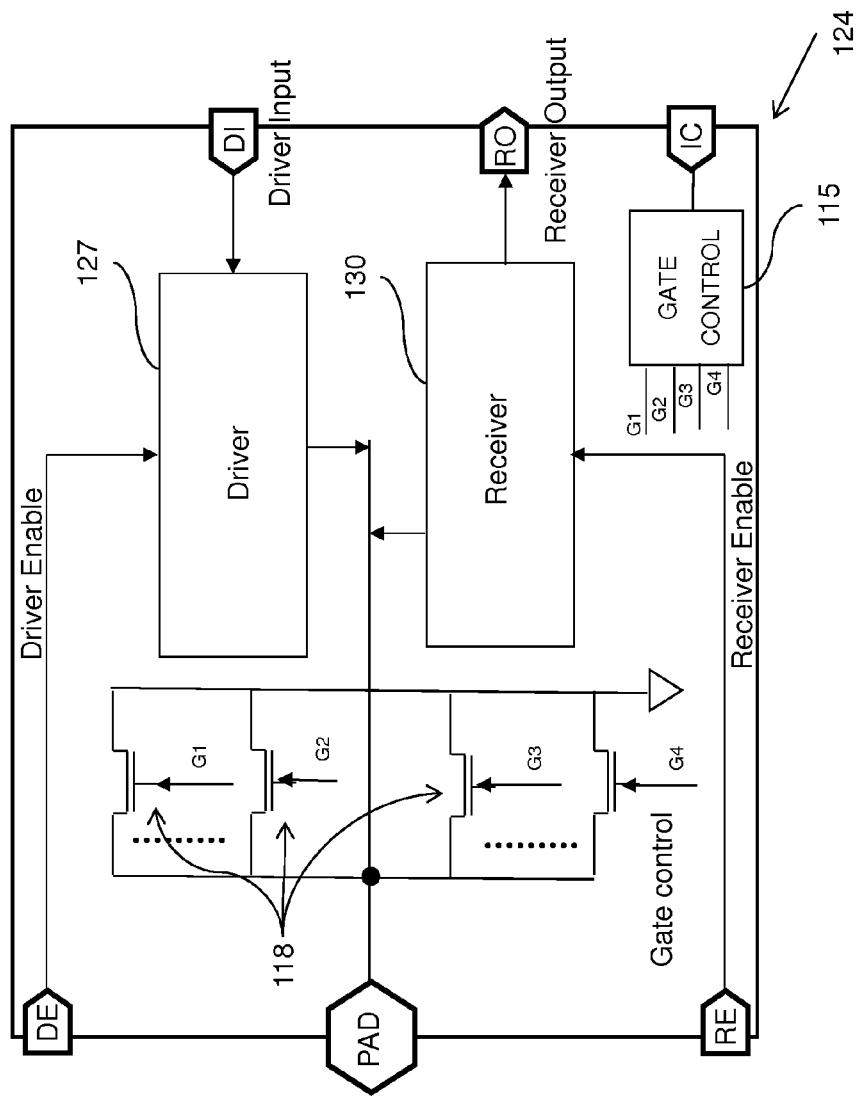
FIG. 6 is a schematic diagram illustrating embodiments of an I/O cell herein.

FIG. 6 shows a specific embodiment of a semiconductor chip 124 having driver 127 and receiver 130 operatively connected to the gate control unit 115. The gate control unit 115 may provide signals to the NOR gates 118 according to the truth table shown in FIG. 7. The driver 127 and receiver 130 are connected to the control current 106 and measure current 109 to coordinate with operation of a photon emission microscope or other appropriate device for measuring photon emission from a semiconductor. The gate control should be either "0" or "1" depending on the type of device under test. For example, for a pFET, the gate control should be "0"; for an nFET, the gate control should be "1".

In the truth table of FIG. 7, PAD represents the external connection on the semiconductor chip 124, which is bonded to a package or circuit board. OSC indicates that the input is oscillating; that is, the IC pin is being actively controlled as shown in the timing diagrams, such as shown in FIG. 4, to perform the Photon Emission/current measurements. In driver mode, the IO is driving a signal onto the chip pad; in receiver mode, the IO is taking the signal on the chip pad shifting the voltage to an internal chip logic voltage, and propagating it to the PO pin available to the internal chip. In Tri-State mode, the chip pad is not externally driven, and therefore the internal RO signal is in an unknown state. In the Embedded Photon Emission Calibration (EPEC) mode, the chip pad is connected to the measure current source.

Figure 8:
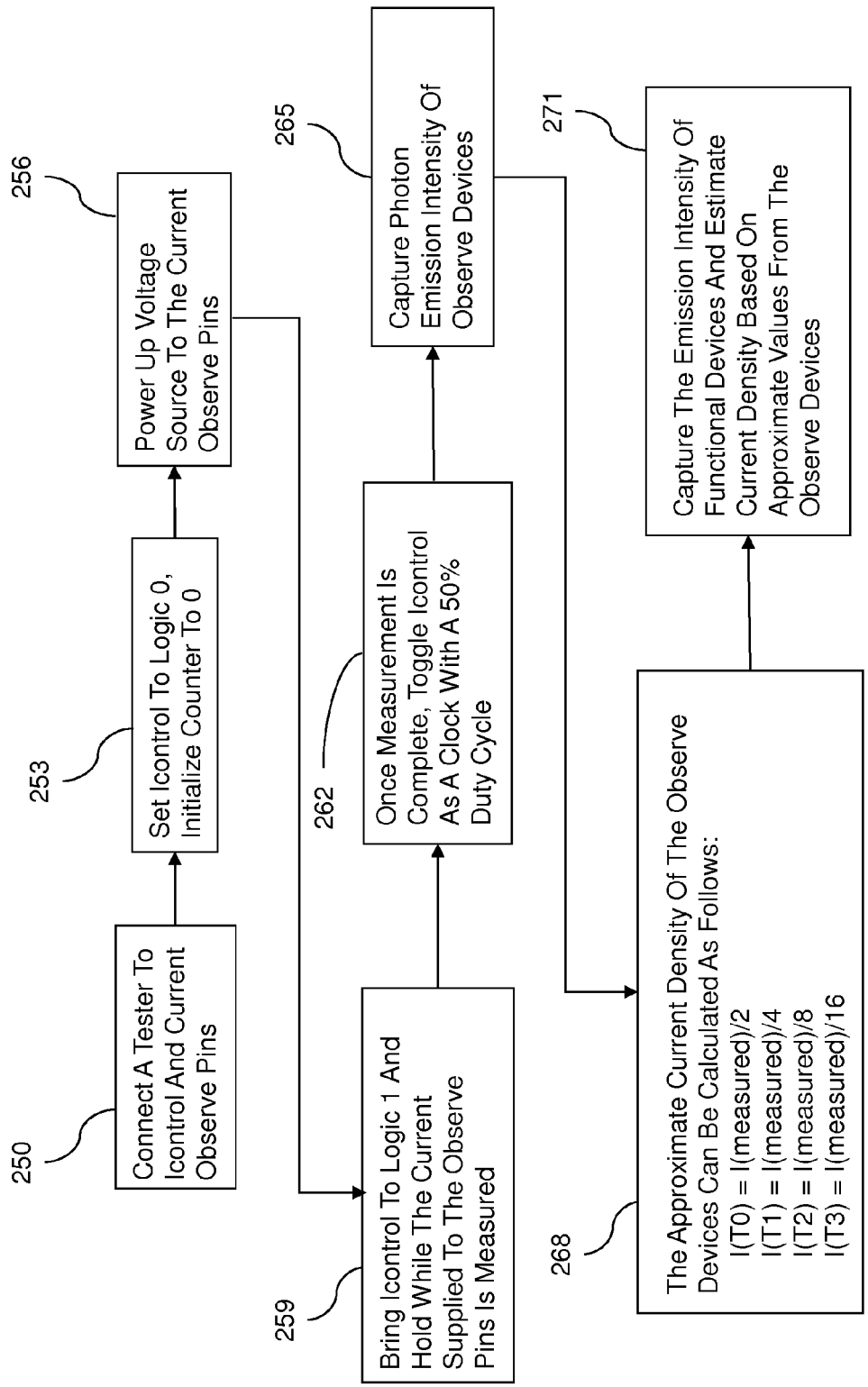
FIG. 8 is a flow diagram illustrating embodiments herein.

FIG. 8 shows a specific embodiment of a method to connect test equipment and to perform PEM analysis of a functional device on a chip with embedded photon emission devices. First, at 250, a test device is connected to measure the control current 106 and the observed measure current 109 using current observation pins, such as 121. At 253, the control current 106 is set to logic "0" and the counter is initialized to "0". At 256, the voltage source to the current observe pins is powered. At 259, the control current 106 is set to logic "1" and the observed measure current 109 is measured. After the observed measure current 109 is measured, at 262, the control current 106 is toggled according to a selected duty cycle. At 265, the luminosity of the photon emission devices 103 is captured. Then, the current density of the photon emission devices 103 is calculated, at 268. Finally, at 271, the photon emission luminosity of the functional device is captured and the current density of the function device is estimated based on approximate values derived from the photon emission devices 103.

Calculation of the current density of the photon emission devices 103 is dependent upon the number of observe devices in the circuit as well as the selected duty cycle for the control current. For example, in the specific example illustrated in FIG. 8 using four photon emission devices 103, the control current 106 may by toggled using a 50% duty cycle. The approximate current density of the observe devices can be calculated as follows:

$$I(T0)=I(\text{measured})/2$$

$$I(T1)=I(\text{measured})/4$$

$$I(T2)=I(\text{measured})/8$$

$$I(T3)=I(\text{measured})/16$$

Figure 9:
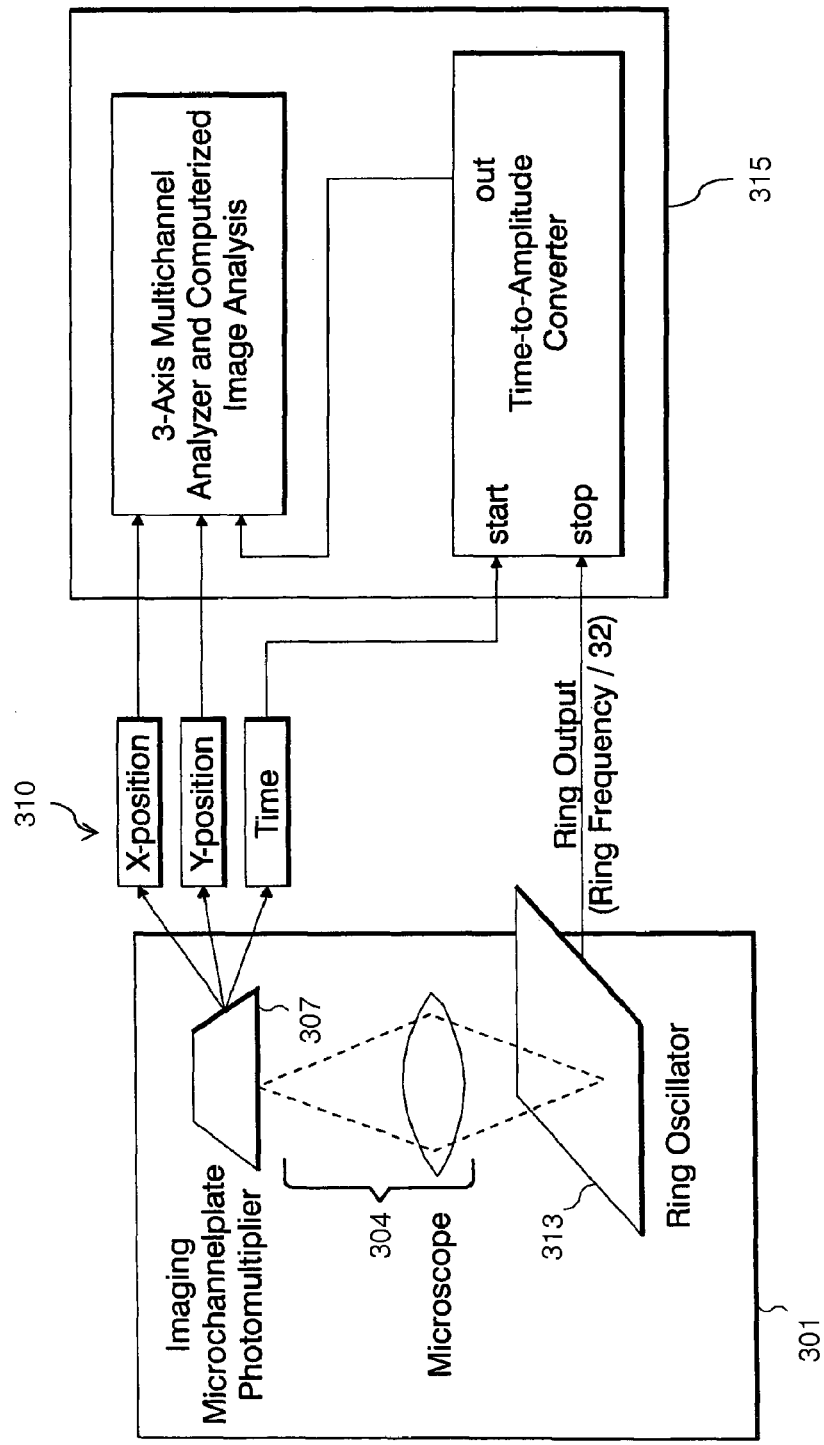
FIG. 9 is a schematic diagram illustrating an apparatus that may be used in the practice of embodiments herein.

According to another embodiment herein, a system for performing physical failure analysis (PFA) techniques for analyzing semi-conductor devices using photon emission microscopy is disclosed. The system comprises a semiconductor chip comprising at least one photon emission device and at least one functional device, and test equipment that collects and compares light emission data from the at least one photon emission device with light emission data from the at least one functional device. FIG. 9 shows schematically a test equipment apparatus that may be used to obtain time resolved optical images and optical waveforms for use as described herein. The apparatus of FIG. 9 comprises a dark space 301, a microscope 304 having at least its objective disposed in the dark space 301, an imaging detector 307 such as an imaging microchannelplate photo multiplier tube, a readout 310 for the imaging detector 307 capable of providing a series of optical images of the emission, each comprising a separate time interval coordinated with the multiple gate signals. Alternatively or in addition, readout 310 is capable of providing a series of optical waveforms detected by the imaging detector 307, where each waveform is obtained from a different portion of the image. A semiconductor integrated circuit to be evaluated 313 is mounted in the dark space 301 at the focus of the microscope objective and powered by a suitable power source. As described above, the semiconductor integrated circuit to be evaluated 313 includes at least one photon emission device emitting a known luminosity for a given current input current and at least one functional device. Ideally, the imaging detector 307 is capable of counting single photons. For a photon-counting detector, the portion of readout 310 that provides temporal information can be of the type described in the literature as photon timing. Other optical sampling techniques such as up-conversion or a streak camera may also be used. The microscope 304 having an imaging detector 307 and the semiconductor integrated circuit to be evaluated 313 are operationally connected to analysis equipment 315.

As will be appreciated by one skilled in the art, aspects of the systems and methods herein may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium (s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Figure 10:
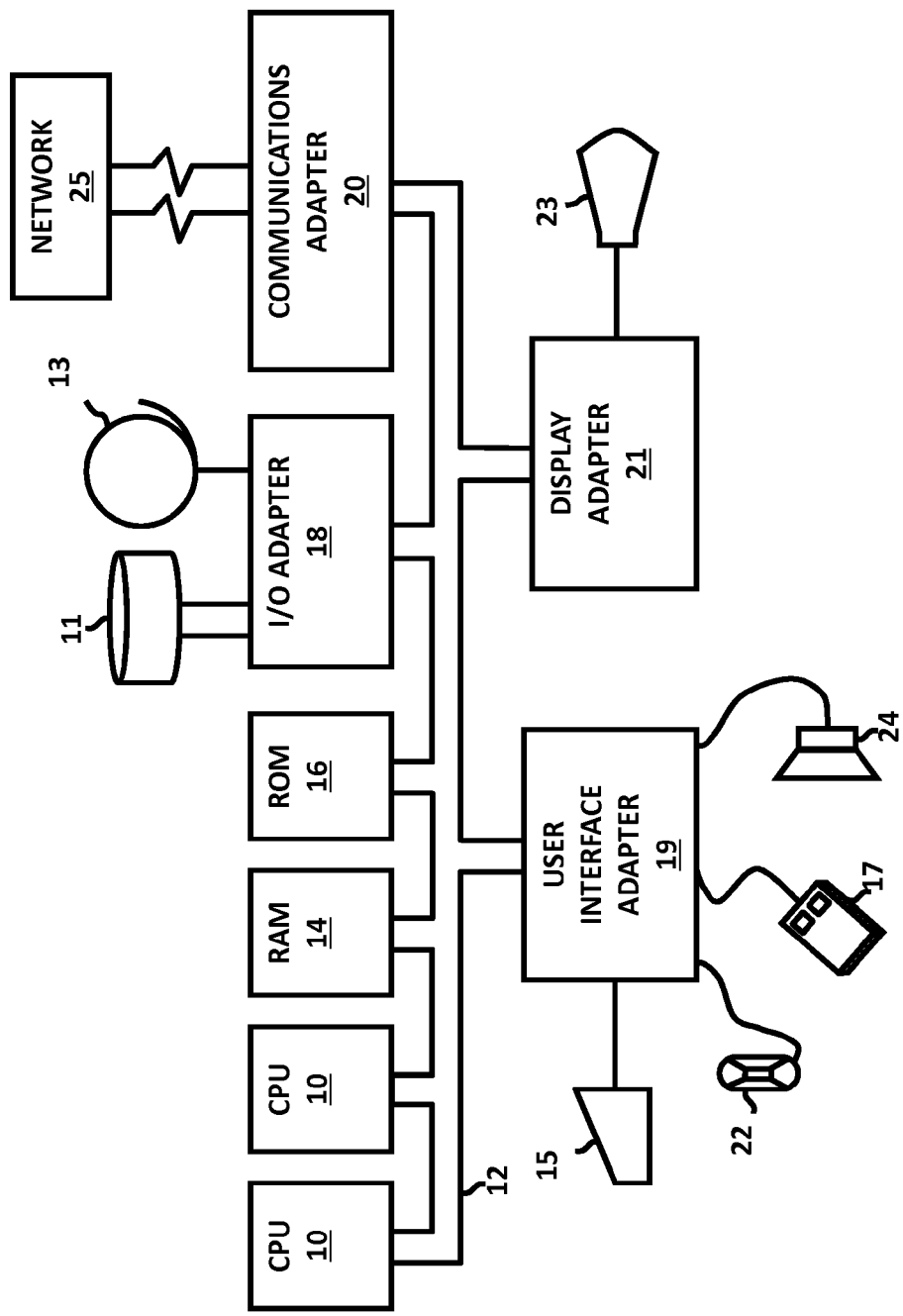
FIG. 10 is a schematic diagram of a hardware system according to embodiments herein.

A representative hardware environment for practicing the embodiments herein is depicted in FIG. 10. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23, which may be embodied as an output device such as a monitor, printer, or transmitter, for example.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well known to those ordinarily skilled in the art and are generally formed by patterning openings/trenches within the substrate and growing or filling the openings with a highly insulating material (this allows different active areas of the substrate to be electrically isolated from one another).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    embedding at least one photon emission device in an integrated circuit having at least one functional device;
    applying control currents to said at least one photon emission device;
    capturing photon emission intensities produced by said at least one photon emission device when said control currents are applied;
    correlating said control currents with said photon emission intensities;
    calculating calibration current densities of said at least one photon emission device based on said photon emission intensities produced by said at least one photon emission device;
    establishing a device specific calibration relationship between photon emission intensity and current density;
    applying a test current to said at least one functional device;
    capturing photon emission intensity produced by said at least one functional device; and
    estimating a functional device current density of said at least one functional device based on said device specific calibration relationship.

2. The method according to claim 1, said at least one photon emission device comprising a plurality of transformer devices physically isolated from said at least one functional device on a semiconductor chip.

3. The method according to claim 1, said applying control currents further comprising:
    applying control input that oscillates, said control input having a controllable duty cycle; and
    varying said control input to said at least one photon emission device.

4. The method according to claim 1, said capturing photon emission intensities further comprising:
    using a collector comprising a microscope having an imaging optical detector providing optical images of said photon emission.

5. The method according to claim 1, said calculating calibration current densities of said at least one photon emission device further comprising:
    determining a relationship between said control currents and said photon emission intensities produced by said at least one photon emission device by applying a control input that oscillates to a gate of said at least one photon emission device, said control input having a controllable duty cycle;
    varying said control input to said gate; and
    measuring a current applied to a source and drain of said at least one photon emission device.

6. The method according to claim 1, said estimating a functional device current density of said at least one functional device being based on a comparison with said calibration current densities of said at least one photon emission device.

7. A system for performing physical failure analysis techniques for analyzing semi-conductor devices using photon emission microscopy, said system comprising:
    a semiconductor chip comprising:
        at least one photon emission calibration device, and
        at least one functional device; and
    test equipment that applies control currents to said at least one photon emission calibration device,
        said test equipment capturing photon emission intensities produced by said at least one photon emission calibration device when said control currents are applied,
        said test equipment correlating said control currents with said photon emission intensities,
        said test equipment calculating calibration current densities of said at least one photon emission calibration device based on said photon emission intensities produced by said at least one photon emission calibration device,
        said test equipment establishing a device specific calibration relationship between photon emission intensity and current density, and
        said test equipment comparing light emission data from said at least one photon emission calibration device with light emission data from said at least one functional device to estimate a functional device current density of said at least one functional device based on said device specific calibration relationship.

8. The system according to claim 7, said at least one photon emission calibration device and said at least one functional device comprising field effect transformers.

9. The system according to claim 7, said test equipment further comprising:
    a collector that collects light emission data from said at least one photon emission calibration device and said at least one functional device.

10. The system according to claim 9, said collector comprising a microscope having an imaging optical detector providing optical images of said light emission.

11. The system according to claim 7, said test equipment further comprising:
    a comparator comparing said light emission data collected from said at least one photon emission calibration device with said light emission data collected from said at least one functional device.

12. The system according to claim 7, said test equipment further comprising:
    an analyzer determining current density for said at least one functional device based on said comparing said light emission data collected from said at least one photon emission calibration device with said light emission data collected from said at least one functional device.

13. An integrated circuit comprising:
    a control input operatively connected to at least one photon emission calibration device;
    a measure input operatively connected to said at least one photon emission calibration device; and
    at least one functional device;
        said at least one photon emission calibration device and said at least one functional device being embedded in a semiconductor chip, said at least one photon emission calibration device producing photon emission intensities when control currents are applied, said photon emission intensity produced by said at least one photon emission calibration device providing calibration current densities of said at least one photon emission calibration device to establish a device specific calibration relationship between photon emission intensity and current density, based on correlating said control currents with said photon emission intensities, and light emission data from said at least one photon emission calibration device being comparable with light emission data from said at least one functional device to estimate a functional device current density of said at least one functional device based on said device specific calibration relationship.

14. The integrated circuit according to claim 13, said at least one photon emission calibration device comprising transformer devices physically isolated from said at least one functional device on said semiconductor chip.

15. The integrated circuit according to claim 13, said at least one photon emission calibration device having a source and drain connected to said measure input that can measure said current external to said semiconductor chip.

16. The integrated circuit according to claim 13, said at least one photon emission calibration device comprising a gate connected to said control input, said control input being variable and having a controllable duty cycle.

17. The integrated circuit according to claim 13, said at least one photon emission calibration device and said at least one functional device comprising field effect transformers.

18. A non-transitory computer readable storage medium readable by a computerized device, said non-transitory computer readable storage medium storing instructions executable by said computerized device to perform a method to determine current density in a functional device in an integrated circuit including at least one photon emission device, said method comprising:

applying control currents to said at least one photon emission device;

capturing photon emission intensities produced by said at least one photon emission device when said control currents are applied;

correlating said control currents with said photon emission intensities;

calculating calibration current densities of said at least one photon emission device based on said photon emission intensity produced by said at least one photon emission device;

establishing a device specific calibration relationship between photon emission intensity and current density;

applying a test current to said functional device;

capturing photon emission intensity produced by said functional device; and estimating a functional device current density of said functional device based on said device specific calibration relationship.

19. The non-transitory computer readable storage medium of claim 18, said applying control currents further comprising:

applying control input that oscillates, said control input having a controllable duty cycle; and varying said control input to said at least one photon emission device.

20. The non-transitory computer readable storage medium of claim 18, said capturing photon emission intensities further comprising:

using a collector comprising a microscope having an imaging optical detector providing optical images of said photon emission.

21. The non-transitory computer readable storage medium of claim 18, further comprising:

determining a relationship between said control currents and said photon emission intensities produced by said at least one photon emission device by applying a control input that oscillates to a gate of said at least one photon emission device, said control input having a controllable duty cycle; and varying said control input to said gate.

22. The non-transitory computer readable storage medium of claim 21, further comprising:

as said control input is varied on said controllable duty cycle, measuring a current applied to a source and drain of said at least one photon emission device.

23. The non-transitory computer readable storage medium of claim 22, further comprising:

calculating said current density of said at least one photon emission device based on a ratio of said control input to said current measured from said source and drain of said at least one photon emission device.

24. The non-transitory computer readable storage medium of claim 18, said estimating said functional device current density of said functional device being based on a comparison with said calibration current densities of said at least one photon emission device.

* * * * *